(12) United States Patent
Park

(10) Patent No.: US 7,875,470 B2
(45) Date of Patent: Jan. 25, 2011

(54) METHOD OF FORMING BUFFER LAYER FOR NITRIDE COMPOUND SEMICONDUCTOR LIGHT EMITTING DEVICE AND NITRIDE COMPOUND SEMICONDUCTOR LIGHT EMITTING DEVICE HAVING THE BUFFER LAYER

(75) Inventor: Hyun Kyu Park, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 42 days.

(21) Appl. No.: 12/093,039

(22) PCT Filed: Mar. 9, 2007

(86) PCT No.: PCT/KR2007/001170

§ 371 (c)(1),
(2), (4) Date: May 8, 2008

(87) PCT Pub. No.: WO2007/105881

PCT Pub. Date: Sep. 20, 2007

(65) Prior Publication Data

US 2008/0251890 A1  Oct. 16, 2008

(30) Foreign Application Priority Data

Mar. 16, 2006  (KR) ............... 10-2006-0024274

(51) Int. Cl.
*H01L 21/00* (2006.01)

(52) U.S. Cl. ............ 438/22; 438/37; 438/46; 438/47; 438/602; 438/604

(58) Field of Classification Search ............ None
See application file for complete search history.

(56) References Cited

U.S. PATENT DOCUMENTS

| 6,744,076 B2 * | 6/2004 | Fukuyama et al. ......... 257/103 |
| 6,869,806 B2 * | 3/2005 | Cui et al. ..................... 438/3 |
| 7,012,016 B2 * | 3/2006 | Gwo ........................ 438/602 |

FOREIGN PATENT DOCUMENTS

| EP | 1041609 | 10/2000 |
| JP | 2001-237457 | 8/2001 |
| JP | 2002-043617 | 2/2002 |
| KR | 10-2005-0014344 | 2/2005 |

* cited by examiner

*Primary Examiner*—Zandra Smith
*Assistant Examiner*—Khanh B Duong
(74) *Attorney, Agent, or Firm*—H.C. Park & Associates, PLC

(57) ABSTRACT

A method of forming a buffer layer for a nitride compound semiconductor light emitting device includes placing a sapphire ($Al_2O_3$) substrate in a reaction chamber; introducing a nitrogen source gas into a reaction chamber; and annealing the substrate in a state where the nitrogen source gas is introduced into the reaction chamber, to form an AlN compound layer on the substrate. The AlN compound layer having intermediate properties between those of the substrate and a semiconductor layer is formed between the substrate and the semiconductor layer. Thus, an interface space between the AlN compound layer and the buffer layer or the semiconductor layer that is to be formed on the AlN compound layer becomes smaller and a crystal stress also becomes smaller, thereby reducing a crack that may be generated due to differences in lattice constant and thermal expansion coefficient between the substrate and the semiconductor layer.

6 Claims, 2 Drawing Sheets

[Fig. 1 (Prior Art)]
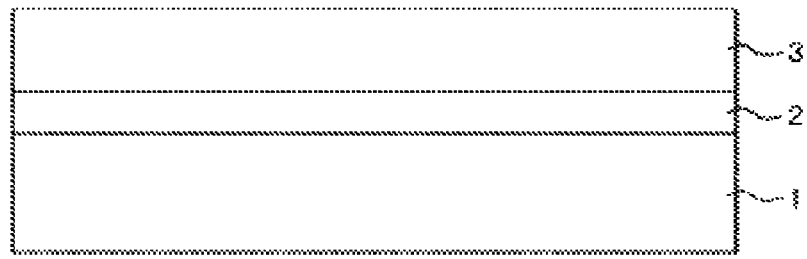
[Fig. 2]
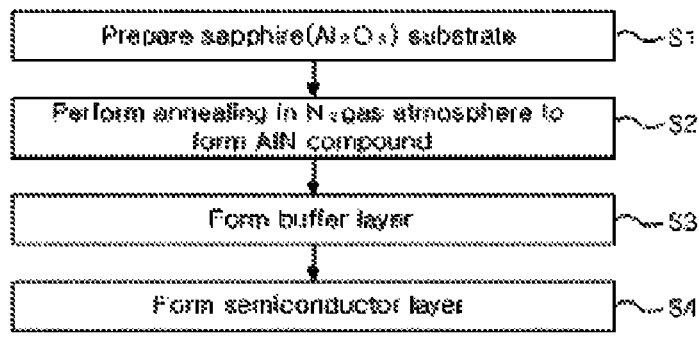
[Fig. 3]
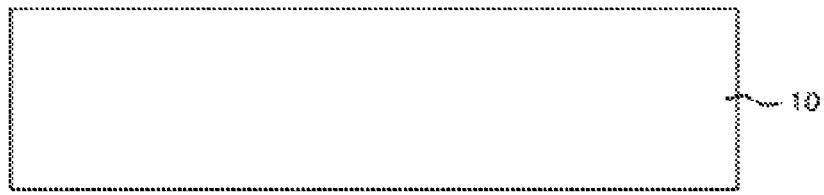
[Fig. 4]
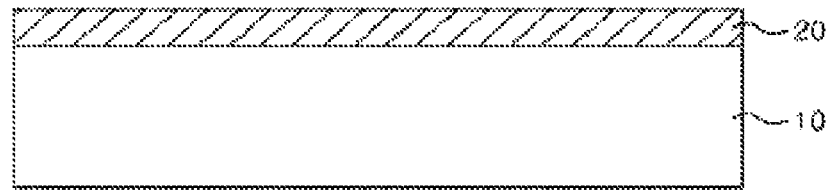
[Fig. 5]
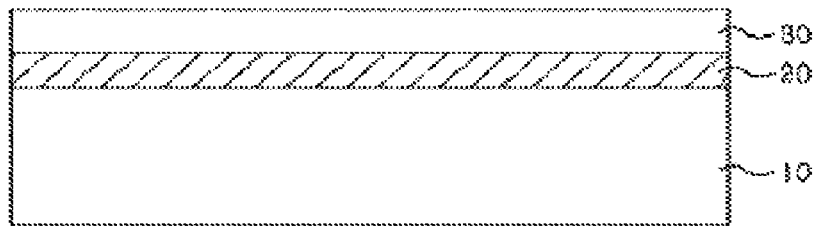

[Fig. 6]
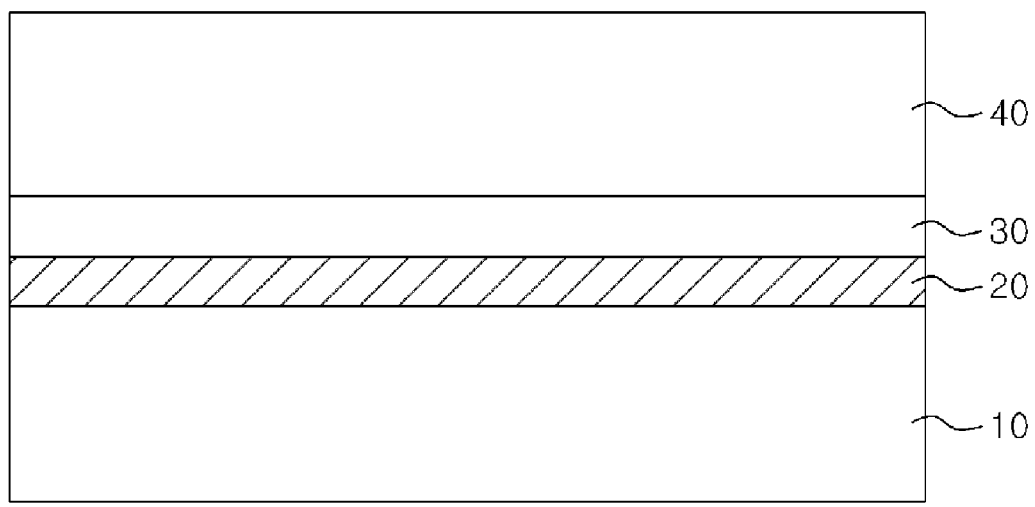

METHOD OF FORMING BUFFER LAYER FOR NITRIDE COMPOUND SEMICONDUCTOR LIGHT EMITTING DEVICE AND NITRIDE COMPOUND SEMICONDUCTOR LIGHT EMITTING DEVICE HAVING THE BUFFER LAYER

CROSS REFERENCE RELATED APPLICATIONS

This application is the National Stage of International Application No. PCT/KR2007/001170, filed on Mar. 9, 2007, and claims priority from and the benefit of Korean Patent Application No. 10-2006-0024274, filed on Mar. 16, 2006, which are all hereby incorporated by reference for all purposes as if fully set forth herein.

BACKGROUND OF THE INVENTION

1. Field of the Invention

The present invention relates to a method of forming a buffer layer for a nitride compound semiconductor light emitting device and a nitride compound semiconductor light emitting device having the buffer layer, and more particularly, to a method of forming a buffer layer for a nitride compound semiconductor light emitting device and a nitride compound semiconductor light emitting device having the buffer layer, wherein a sapphire ($Al_2O_3$) substrate is annealed in a state where a nitrogen source gas is introduced so as to form an AlN compound layer on the sapphire substrate, and a semiconductor layer is then formed on the AlN compound layer, thereby reducing a crack or the like that may be generated due to differences in lattice constant and thermal expansion coefficient between the substrate and the semiconductor layer.

2. Discussion of the Background

Generally, since a nitride compound semiconductor containing an element of Group III, such as GaN and AlN, have excellent thermal stability and a direct transition type energy band structure, they have been recently spotlighted as materials of photoelectronic devices in a blue light region and an ultraviolet light region. Specifically, blue or green light emitting devices using GaN have been used in various applications such as large-sized natural color flat-panel displays, traffic signal lights, indoor illumination, high-density light sources, high-resolution output systems, and optical communication.

A nitride compound semiconductor containing an element of Group III is grown on a heterogeneous substrate, which is made of sapphire, silicone carbide or the like having the structure of a hexagonal system, by using a process such as metal organic chemical vapor deposition (MOCVD) or molecular beam epitaxy (MBE). "Heterogeneous substrate" as used herein means a substrate made of a material different from upper semiconductor layers grown on the substrate. If a layer of a nitride compound semiconductor containing an element of Group III is formed on the heterogeneous substrate, a crack or warpage and thence a dislocation may be generated in the semiconductor layer due to differences in lattice constant and thermal expansion coefficient between the semiconductor layer and the substrate. The crack, warpage and dislocation in the semiconductor layer deteriorate properties of a light emitting device. Therefore, in order to reduce a stress that may be generated due to the differences in lattice constant and thermal expansion coefficient between the substrate and the semiconductor layer, a buffer layer has been typically used.

FIG. 1 is a sectional view illustrating a conventional method of forming a buffer layer for a nitride compound semiconductor light emitting device.

Referring to FIG. 1, a buffer layer 2 is formed on a substrate 1. The buffer layer 2 is formed of $Al_xGa_{1-x}N$ ($0 \leq x \leq 1$) by using the MOCVD or MBE process.

Upon formation of the buffer layer 2, trimethyl aluminum (TMAl; $Al(CH_3)_3$) and trimethyl gallium (TMG; $Ga(CH_3)_3$) are used as source gases for Al and Ga, respectively, while $NH_3$ is used as a reaction gas. After the source gases and the reaction gas are introduced into a reaction chamber, the buffer layer 2 is formed at a temperature of 400° C. to 800° C.

Then, the temperature of the reaction chamber is increased to 900° C. to 1200° C., and a GaN-based semiconductor layer 3 having P-N junction is formed on the buffer layer 2. Thereafter, electrodes are formed on the semiconductor layer 3 to fabricate a light emitting device.

According to the prior art, the formation of the buffer layer 2 between the semiconductor layer 3 and the substrate 1 can reduce a crack that may be generated due to the differences in lattice constant and thermal expansion coefficient difference between the substrate 1 and the semiconductor layer 3.

However, since the buffer layer 2 that has been grown at a lower temperature is generally grown in a direction perpendicular to the substrate, the buffer layer 2 has a columnar structure. Further, since an $Al_xGa_{1-x}N$ ($0 \leq x \leq 1$) crystal has a relatively strong binding force between atoms within the crystal, a large interface space exists between columns within the columnar structure and a crystal stress is great. Meanwhile, the semiconductor layer 3 is influenced by the crystal structure, crystalloid and column size distribution of the buffer layer 2 that is positioned below the semiconductor layer 3. That is, crystal defects in the buffer layer 2 are transferred to the semiconductor layer 3 positioned above the buffer layer 2. Therefore, crystal defects depending on the columnar structure of the buffer layer 2 are exhibited as crystal defects in the semiconductor layer 3.

SUMMARY OF THE INVENTION

An object of the present invention is to provide a method of forming a buffer layer, wherein upon formation of the buffer layer between a substrate and a semiconductor layer to fabricate a nitride compound semiconductor light emitting device, crystal defects can be reduced in the semiconductor layer grown on the buffer layer, and a nitride compound semiconductor light emitting device having the buffer layer.

According to an aspect of the present invention for achieving the object, there is provided a method of forming a buffer layer for a nitride compound semiconductor light emitting device, comprising the steps of: placing a sapphire ($Al_2O_3$) substrate in a reaction chamber; introducing a nitrogen source gas into the reaction chamber; and annealing the sapphire ($Al_2O_3$) substrate in a state where the nitrogen source gas is introduced into the reaction chamber, to form an AlN compound layer on a surface of the sapphire substrate.

The method may further comprise the step of forming a nitride compound buffer layer on the AlN compound layer.

The nitride compound buffer layer may be formed of $In_xAl_yGa_{1-x-y}N$ ($0 \leq x,y,x+y \leq 1$).

By means of the method of forming a buffer layer described above, it is possible to fabricate a nitride compound semiconductor light emitting device, comprising a sapphire ($Al_2O_3$) substrate; a semiconductor layer formed on the sapphire ($Al_2O_3$) substrate; and an AlN compound layer formed through reaction of the sapphire ($Al_2O_3$) substrate with a nitrogen source gas in an interface between the semiconductor layer and the sapphire ($Al_2O_3$) substrate.

The nitride compound semiconductor light emitting device may further comprise a nitride compound buffer layer formed between the AlN compound layer and the semiconductor layer.

The nitride compound buffer layer may be formed of $In_xAl_yGa_{1-x-y}N$ ($0 \leq x,y,x+y \leq 1$).

According to the present invention, an AlN compound layer having intermediate properties between those of a substrate and a semiconductor layer is formed between the substrate and the semiconductor layer.

Thus, an interface space between the AlN compound layer and the buffer layer or the semiconductor layer that is to be formed on the AlN compound layer becomes smaller and a crystal stress also becomes smaller, thereby effectively reducing a crack that may be generated due to differences in lattice constant and thermal expansion coefficient between the substrate and the semiconductor layer.

Meanwhile, the semiconductor layer is influenced by the crystal structure, crystalloid and column size distribution of the buffer layer that is positioned below the semiconductor layer. That is, crystal defects in the buffer layer may be transferred to the semiconductor layer positioned above the buffer layer.

According to the present invention, however, since the buffer layer is formed on the AlN compound layer, the crystal defects in the buffer layer are reduced so that crystal defects in the semiconductor layer are reduced, thereby improving the light yield of a nitride compound semiconductor light emitting device.

BRIEF DESCRIPTION OF THE DRAWINGS

FIG. 1 is a sectional view illustrating a conventional method of forming a buffer layer for a nitride compound semiconductor light emitting device.

FIG. 2 is a flowchart illustrating a method of forming a buffer layer for a nitride compound semiconductor light emitting device according to an embodiment of the present invention.

FIGS. 3 to 6 are sectional views illustrating the method of forming a buffer layer for a nitride compound semiconductor light emitting device according to the embodiment of the present invention.

DETAILED DESCRIPTION OF THE ILLUSTRATED EMBODIMENTS

Hereinafter, a preferred embodiment of the present invention will be described in detail with reference to the accompanying drawings. The following embodiment is provided only for illustrative purposes so that those skilled in the art can fully understand the spirit of the present invention.

Therefore, the present invention is not limited to the following embodiment but may be implemented in other forms. In the drawings, the widths, lengths, thicknesses and the like of elements may be exaggerated for convenience of illustration. Like reference numerals indicate like elements throughout the specification and drawings.

FIG. 2 is a flowchart illustrating a method of forming a buffer layer for a nitride compound semiconductor light emitting device according to an embodiment of the present invention, and FIGS. 3 to 6 are sectional views illustrating the method of forming a buffer layer for a nitride compound semiconductor light emitting device according to the embodiment of the present invention.

Referring to FIGS. 2 and 3, a substrate 10 is prepared and placed in a reaction chamber (S1). The substrate is a sapphire ($Al_2O_3$) substrate.

Referring to FIGS. 2 and 4, after the substrate 10 has been placed in the reaction chamber, $N_2$ gas is introduced into the reaction chamber at a high temperature (1000° C.), and an annealing process is performed for several hours to dozens of hours (S2).

Therefore, a surface of the substrate 10 which is exposed to the $N_2$ gas is subject to a reaction according to the formula 1 in following the Chemistry FIG. 1:

Chemistry FIG. 1

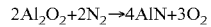

That is, when the $N_2$ gas has been introduced into the reaction chamber and the annealing process is performed for the sapphire substrate at the high temperature, oxygen atoms contained in the sapphire ($Al_2O_3$) substrate are dissociated to generate $O_2$ gas, and Al is reacted with the $N_2$ gas to form an AlN compound layer.

Accordingly, a thin AlN compound layer 20 is formed on an entire surface of the substrate 10. More specifically, the AlN compound layer is formed from the surface of the substrate 10 to a region where the $N_2$ gas is reacted with Al contained in the sapphire ($Al_2O_3$) substrate.

Referring to FIGS. 2 and 5, a buffer layer 30 is formed on the AlN compound layer 20 that has been formed on the surface of the substrate 10 (S3). The buffer layer 30 is formed of $In_xAl_yGa_{1-x-y}N$ ($0 \leq x,y,x+y \leq 1$) by using the MOCVD or MBE process.

Aluminum (Al), thimethyl aluminum (TMA), triethyl aluminum (TEA), trimethylamine aluminum (TMAA; $AlH_3.N(CH_3)_3$), dimethylethylamine aluminum (DMEAA; $AlH_3.N(CH_3)_2(CH_2)H_5$), triisobutyl aluminum (TIBA; $Al(iso-C_4H_9)_3$); trimethyl indium (TMI; $In(CH_3)_3$); gallium, trimethyl gallium (TMG) and/or triethyl gallium (TEG) or the like are used as source gases for forming the buffer layer 30, while $NH_3$ is used as a reaction gas. After the source gases and the reaction gas are introduced into the reaction chamber, the buffer layer 30 is formed at a temperature of 400° C. to 800° C.

Referring to FIGS. 2 and 6, after the buffer layer 30 is formed, a GaN-based semiconductor layer 40 having P-N junction is formed on the buffer layer 30 at a temperature of 900° C. to 1200° C. in the reaction chamber by using the MOCVD or MBE process (S4). Then, electrodes are formed on the semiconductor layer 40 to fabricate a light emitting device.

At this time, the semiconductor layer 40 may be formed by sequentially forming a first conductive semiconductor layer, an active layer and a second conductive semiconductor layer on the buffer layer 30.

The present invention has been described in connection with the preferred embodiment. However, it can be understood by those skilled in the art that various different embodiments other than the preferred embodiment specifically described above also fall within the scope and sprit of the present invention.

For example, although $N_2$ gas has been used as the nitrogen source gas in the preferred embodiment of the present invention, $NH_3$ gas may be used the nitrogen source gas.

Further, although the present invention has been described in connection with the preferred embodiment in which the AlN compound layer 20 and the buffer layer 30 are formed between the substrate 10 and the semiconductor layer 40 to fabricate a nitride compound semiconductor light emitting device, the semiconductor layer 40 may be formed on the AlN compound layer 20 without additionally forming the buffer layer 30 on the AlN compound layer 20, to fabricate a nitride compound semiconductor light emitting device.

The invention claimed is:

1. A method of forming a buffer layer for a nitride compound semiconductor light emitting device, the method comprising:

placing a sapphire ($Al_2O_3$) substrate in a reaction chamber;

introducing a nitrogen source gas into the reaction chamber;

annealing the sapphire ($Al_2O_3$) substrate in a state where the nitrogen source gas is introduced into the reaction chamber, to form an AlN compound layer directly on a surface of the sapphire substrate; and forming a nitride compound buffer layer on the AlN compound layer, wherein the nitrogen source gas is introduced into the reaction chamber at 1,000° C., and wherein the nitride compound buffer layer is formed at a temperature of 400-800° C.

2. The method as claimed in claim 1, wherein the nitride compound buffer layer is formed of $In_xAl_yGa_{1-x-y}N$ ($0 \leq x,y$, $x+y \leq 1$).

3. A nitride compound semiconductor light emitting device, fabricated by the method of claim 2.

4. The method as claimed in claim 1, wherein the AlN compound layer is formed through reaction of an Al in the sapphire ($Al_2O_3$) substrate with a nitrogen in the nitrogen source gas.

5. A nitride compound semiconductor light emitting device, fabricated by the method of claim 4.

6. A nitride compound semiconductor light emitting device, fabricated by the method of claim 1.

* * * * *